United States Patent [19]

Ishizuka et al.

[11] Patent Number: 5,006,921
[45] Date of Patent: Apr. 9, 1991

[54] POWER SEMICONDUCTOR SWITCHING APPARATUS WITH HEAT SINKS

[75] Inventors: Masaru Ishizuka, Kawasaki; Yasuyuki Yokono, Tokyo; Asako Matsuura, Yokohama; Yoshio Kamei, Yoshikawa; Hiromichi Ohashi, Yokohama; Mitsuhiko Kitagawa, Tokyo; Tomiya Sasaki, both of Tokyo; Shigeki Monma, Yokohama, all of Japan

[73] Assignee: Kabushiki Kaisha Toshiba, Kawasaki, Japan

[21] Appl. No.: 331,288

[22] Filed: Mar. 31, 1989

[30] Foreign Application Priority Data

| Mar. 31, 1988 | [JP] | Japan | 63-76083 |
| Mar. 31, 1988 | [JP] | Japan | 63-78977 |
| Aug. 31, 1988 | [JP] | Japan | 63-214862 |
| Sep. 30, 1988 | [JP] | Japan | 63-243813 |

[51] Int. Cl.$^5$ .......................................... H01L 23/42
[52] U.S. Cl. ......................................... 357/74; 357/75; 357/79; 357/80; 357/81; 357/82

[58] Field of Search ............... 357/79, 81, 74, 75, 357/82, 80

[56] References Cited

FOREIGN PATENT DOCUMENTS

| 8218745 | 6/1983 | Fed. Rep. of Germany . |
| 53-143174 | 12/1978 | Japan . |
| 54-89574 | 7/1979 | Japan . |
| 57-30357 | 2/1982 | Japan . |

OTHER PUBLICATIONS

Mizunoya et al., "Aluminum-Nitride DBC Substrate," 1986, pp. 811–814.

Primary Examiner—William Mintel
Attorney, Agent, or Firm—Oblon, Spivak, McClelland, Maier & Neustadt

[57] ABSTRACT

A semiconductor switching apparatus includes a member for radiating heat generated from semiconductor switching element chips and for reducing a thermal stress. The lengths of gate electrode wires are equally set. The semiconductor switching apparatus has a large capacity and good switching characteristics.

77 Claims, 14 Drawing Sheets

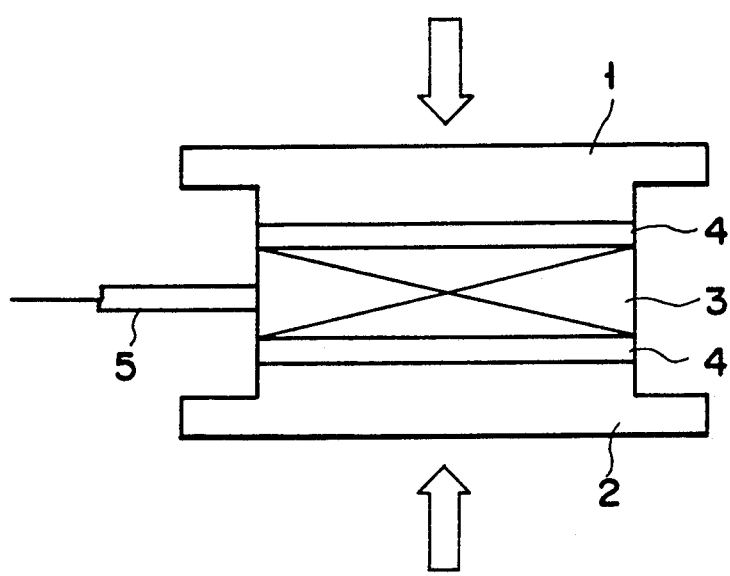
F I G. 1

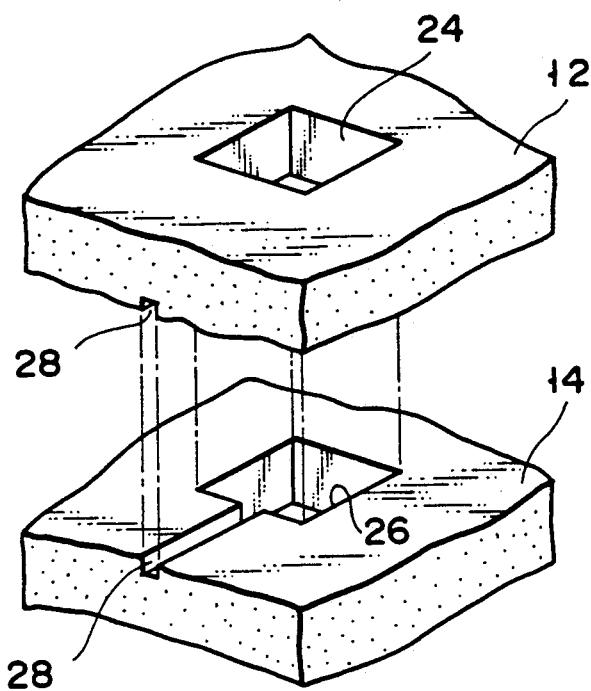
F I G. 4
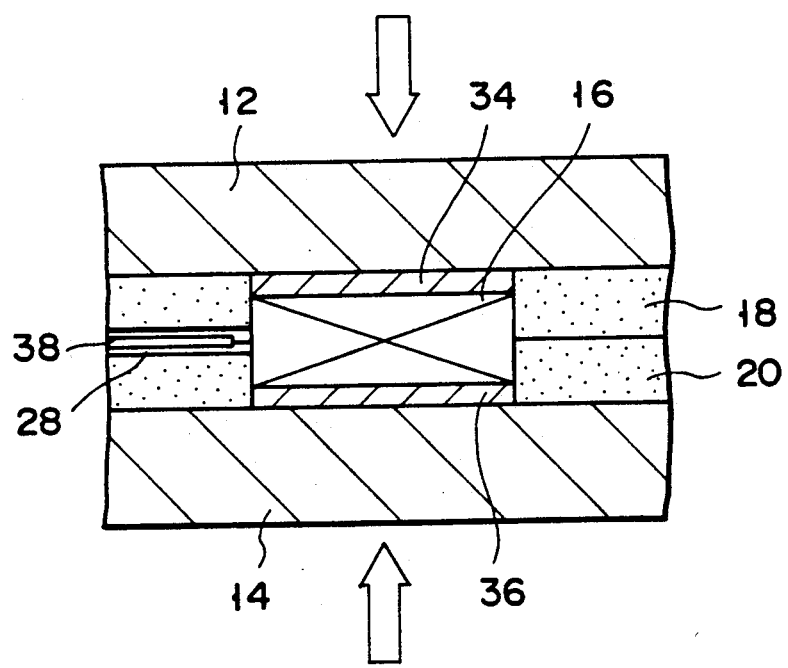
F I G. 5

POWER SEMICONDUCTOR SWITCHING APPARATUS WITH HEAT SINKS

BACKGROUND OF THE INVENTION

1. Field of the Invention

The present invention relates to a semiconductor switching apparatus and, more particularly, to a power semiconductor switching apparatus.

2. Description of the Related Art

A semiconductor switching apparatus has been widely used as a switch for a power circuit. As an example of such a semiconductor switching apparatus, a power semiconductor switching apparatus for use in a power circuit in which a current of several hundreds A (ampere) or more flows is schematically shown in FIG. 1. This semiconductor switching apparatus comprises an anode electrode 1 made of copper and serving as a heat sink and a cathode electrode 2 made of copper and serving as a heat sink. Two metal layers 4 are formed in contact with the anode and cathode electrodes 1 and 2, respectively. A semiconductor chip 3 constituting a semiconductor switching element such as a thyristor or a GTO is formed between the layers 4. The chip 3 is in contact with the layers 4. A gate electrode 5 is connected to the chip 3. The switching apparatus is covered with a case (not shown). When this semiconductor switching apparatus is completed as a product, forces are externally applied on the anode and cathode electrodes 1 and 2 in directions indicated by arrows. Therefore, the anode and cathode electrodes 1 and 2, the semiconductor chip 3 and the metal layers 4 are urged against each other. This is to sufficiently decrease a thermal resistance induced between the chip 3 and the electrodes 1 and 2 due to heat generated in the chip when the switching apparatus is used in a power circuit. A large thermal stress is generated in the chip 3 due to a difference between thermal expansion coefficients of the electrodes 1 and 2 and the chip 3. The layers 4 are formed in order to reduce this thermal stress.

A method of urging and mounting a semiconductor element is disclosed in Japanese Patent Disclosure (Kokai) No. 53-143174. In this prior art, a disk-like thyristor is used. Thermally conductive fins are arranged at both sides of the thyristor. A pair of a bolt and a nut are located around the thyristor to extend through the fins at the both sides of the thyristor. An interval between the fins is narrowed by tightening the bolt and nut, thereby applying a force on the thyristor. As a result, the thyristor as a semiconductor element is urged and mounted by the fins. Another mounting method is disclosed in Japanese Patent Disclosure (Kokai) No. 54-89574. This prior art discloses a tightening apparatus for an electronic semiconductor element. This apparatus employs a flat thyristor as a semiconductor element. Cooling members are arranged at both sides of the thyristor. A projection extends outward from a central portion of one cooling member. An insulator is located at a side portion of the thyristor. A leaf spring is located outside the cooling member having the projection. Holes for receiving a bolt are formed in the two cooling members, the insulator and the leaf spring. The bolt is inserted in the holes. A nut is threadably engaged with the bolt from outside the leaf spring. When the nut is brought into contact with the leaf spring, a force is applied on the leaf spring. When the leaf spring is brought into contact with the projection of the cooling member, the force is applied on the cooling member. In this manner, the force is applied on the thyristor located between the cooling members. As a result, the thyristor is urged against the cooling members located at its both sides.

In the conventional power semiconductor switching apparatus shown in FIG. 1, in order to increase a current capacity, the diameter of the semiconductor chip 3 must be increased. For this purpose, a large semiconductor wafer is required. When the current capacity of the switching apparatus is increased, heat generated from the chip is increased. Therefore, a means for efficiently radiating the heat and a means for reducing a stress induced due to the heat are necessary. In order to improve switching characteristics of the semiconductor switching apparatus, a semiconductor wafer must be micropatterned. It is very difficult to perform micropatterning within the entire large semiconductor wafer with equal precision. For this reason, if a structure of the conventional semiconductor switching apparatus is adopted, it is difficult to manufacture a power semiconductor switching apparatus having a large capacity and good switching characteristics.

In addition, in the conventional semiconductor switching apparatus, heat is radiated from an electrode surface of the semiconductor chip 3. For this reason, in order to sufficiently radiate the heat from the chip 3, a relatively large urging force must be externally applied on the switching apparatus. The urging force, however, is not always in proportion to a heat radiation efficiency. Therefore, it is meaningless to apply a very large urging force on the switching apparatus. Also, if a very large urging force is applied between the anode and cathode, it becomes difficult to reduce the thermal stress induced in the semiconductor chip 3, and the chip itself may be damaged. In the conventional switching apparatus, each member may be broken due to the thermal stress because the urging force is applied. As a result, according to the conventional semiconductor switching apparatus, a cooling performance is limited, and it is difficult to obtain a large capacity.

SUMMARY OF THE INVENTION

It is an object of the present invention to provide a power semiconductor switching apparatus which has a large current capacity and a high performance and can be easily manufactured.

A power semiconductor switching apparatus according to the present invention comprises an anode electrode serving as a heat sink, a cathode electrode serving as a heat sink, a plurality of parallel semiconductor switching element chips arranged between the anode and cathode electrodes, the number of semiconductor switching element chips being set such that a total of rated currents flowing through the chips becomes equal to or larger than a rated current of the switching apparatus, and a gate electrode wire connected to each of the chips.

The semiconductor switching apparatus of the present invention is also arranged as follows. That is, this semiconductor switching apparatus comprises an anode electrode serving as a heat sink, a cathode electrode serving as a heat sink, a plurality of semiconductor switching element chips arranged between the anode and cathode electrodes, the number of semiconductor switching element chips being set such that a total of rated currents flowing through the chips becomes equal to or larger than a rated current of the switching apparatus, and a gate electrode plate arranged between the anode and cathode electrodes, the gate electrode plate being connected to an external lead wire, and gate electrode wires being connected to the chips and the above gate electrode plate respectively.

The power semiconductor switching apparatus of the present invention is also arranged as follows. That is, this power semiconductor switching apparatus comprises an anode electrode serving as a heat sink, a cathode electrode serving as a heat sink, at least one semiconductor switching element chip arranged between the anode and cathode electrodes, a gate electrode wire connected to the chip, and means for reducing a thermal stress induced in the chip and conducting heat from surface of the chip to the anode and cathode electrodes.

The power semiconductor switching apparatus of the present invention is also arranged as follows. That is, this power semiconductor switching apparatus comprises an anode electrode and a cathode electrode, at least one of which has a cavity therein, a plurality of semiconductor switching element chips arranged between the anode and cathode electrodes, a gate electrode wire connected to each of the chips, and a cooling means for circulating a coolant in the cavities in the anode and cathode electrodes to cool the chips.

According to the present invention, a power semiconductor switching apparatus having a larger capacity and a higher performance can be provided.

BRIEF DESCRIPTION OF THE DRAWINGS

FIG. 1 is a schematic view showing a conventional semiconductor switching apparatus;

FIG. 4 is a perspective view showing part of the switching apparatus shown in FIG. 2;

FIG. 5 is a sectional view taken along a line B—B in FIG. 2;

DETAILED DESCRIPTION OF THE PREFERRED EMBODIMENTS

Embodiments according to the present invention will be described below with reference to the accompanying drawings.

Figure 2:
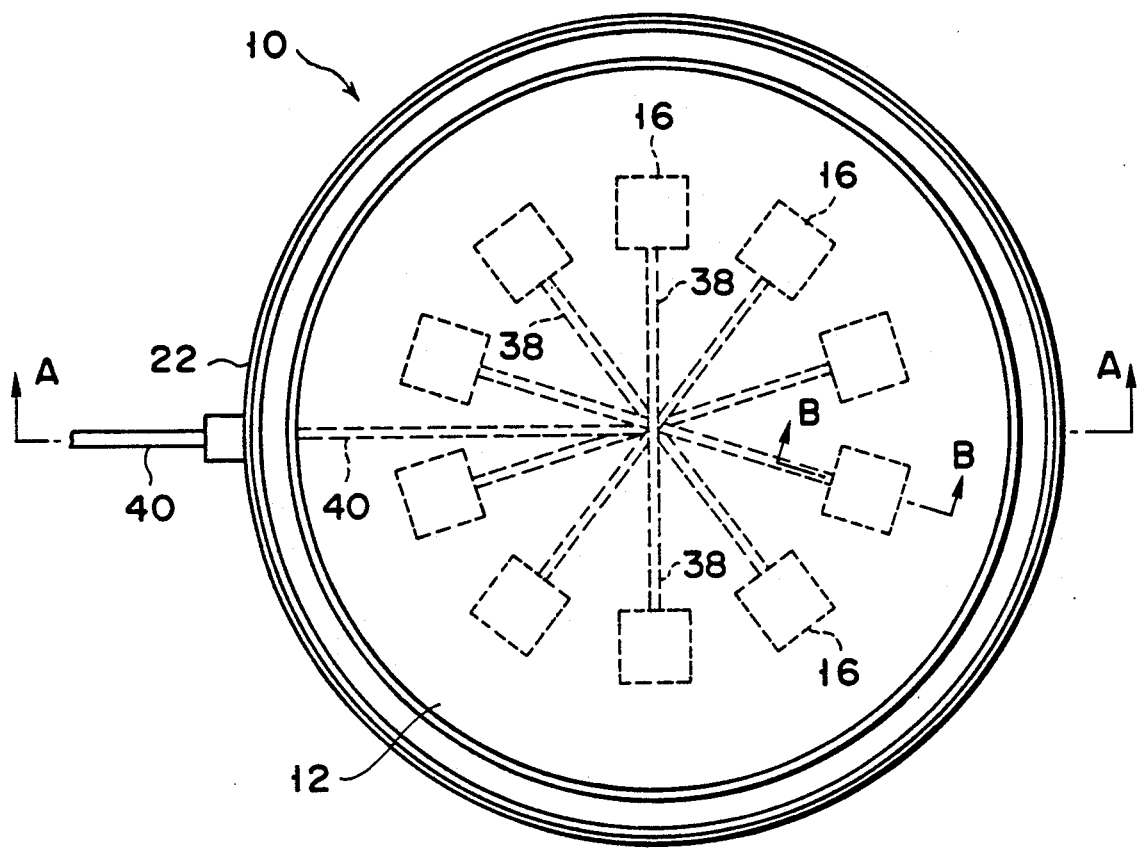
FIG. 2 is a plan view showing a semiconductor switching apparatus according to a first embodiment of the present invention.
Figure 3:
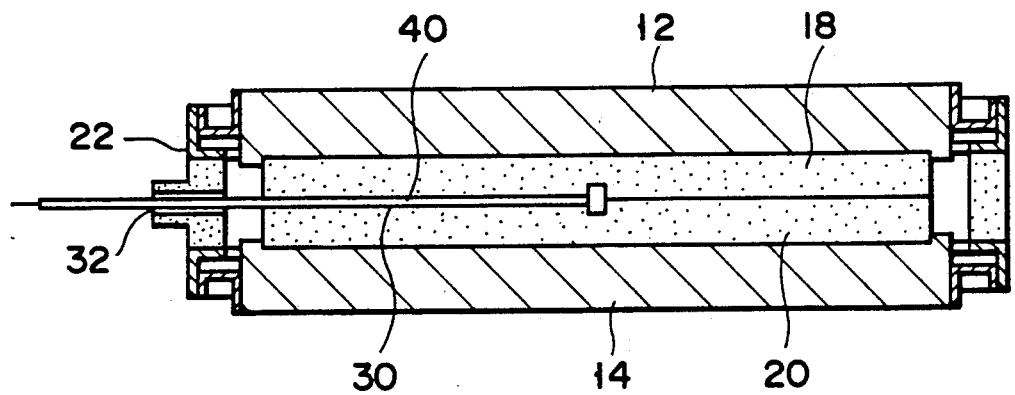
FIG. 3 is a sectional view taken along a line A—A in FIG. 2.

FIGS. 2 and 3 show a power semiconductor switching apparatus according to a first embodiment of the present invention. A switching apparatus 10 comprises anode and cathode electrodes 12 and 14 each formed of a 10-mm thick, 90-mm diameter disk-like copper plate. The anode and cathode electrodes 12 and 14 are arranged to oppose each other. Ten circularly arranged semiconductor switching element chips 16 and two aluminum nitride (AlN) plates 18 and 20 arranged around the chips 16 are located between the electrodes 12 and 14. An insulative case 22 surrounds the circumferential surface of the switching apparatus.

A structure of this semiconductor switching apparatus will be described in detail below. As shown in FIG. 3, the AlN plate 18 is in contact with the anode electrode 12, and the AlN plate 20 is in contact with the cathode electrode 14. The AlN plates 18 and 20 are in contact with each other. As shown in FIG. 4, square holes 24 and 26 for inserting the chip 16 or the like therein are formed in the AlN plates 18 and 20, respectively. Each side of the hole 24 or 26 is, e.g., 10 mm. Ten such holes 24 (26) are formed at equal distances radially from the center of the plate 18 (20). A groove 28 is formed from each hole 24 (26) toward the center of the plate 18 (20). A groove 30 is also formed from the center of the plate 18 (20) to the outside. A hole 32 corresponding to the grooves 30 is formed in the case 22. As shown in FIG. 5, each hole 24 (26) houses a molybdenum plate 34 which is in contact with the anode electrode 12, a molybdenum plate 36 which is in contact with the cathode electrode 14, and the semiconductor switching element chip 16 arranged between the two molybdenum plates 34 and 36. Each chip 16 is constituted by an insulated gate type transistor such as a MOSFET or IGBT formed by processing a silicon wafer. A total thickness of the plates 34 and 36 and the chip 16 is slightly larger than a total thickness of the AlN plates 18 and 20. A gate electrode wire 38 connected to each chip 16 extends through the grooves 28. A lead wire 40 for an external connection is housed in the grooves 30. The gate electrode wires 38 are connected to each other at the center of the plate 18 (20). The lead wire 40 is also connected to this connection portion.

As shown in FIG. 5, the power semiconductor switching apparatus 10 having the above arrangement is manufactured by applying urging forces in directions indicated by arrows. When a current is flowed through the switching apparatus 10, each chip 16 generates heat. A thermal expansion coefficient of the molybdenum plate 34 (36) is close to that of silicon. Therefore, the molybdenum plates 34 and 36 reduce a thermal stress generated in a diameter direction of each chip due to difference between thermal expansion coefficients of the electrodes 12 and 14 and the chips 16. The AlN plate 18 (20) has a thermal expansion coefficient close to that of silicon, is insulative and has good thermal conductivity. Therefore, the AlN plates 18 and 20 radiate the heat generated by each chip 16 to reduce a thermal stress in a diameter direction. In addition, the plates 18 and 20 insulate the anode and cathode electrodes 12 and 14, and the chips 16 from each other to reduce a heat resistance between the outer surfaces of each chip 16 and the electrodes 12 and 14.

In the above semiconductor switching apparatus 10, ten independent chips 16 are parallelly arranged between the anode and cathode electrodes 12 and 14. If a rated current capacity of each chip 16 is 50 A, a total rated current capacity of the apparatus becomes 500 A. By changing the number of the chips 16, a switching apparatus having a desired current capacity can be manufactured. In general, it is difficult to manufacture a high-performance switching apparatus having a current capacity of 500 A and good switching characteristics by a single semiconductor chip. This is because it is difficult to obtain uniform precision of respective units of a switching apparatus due to manufacturing limitations. As in the switching apparatus of the present invention, however, if a plurality of chips 16 are parallelly arranged, a desired current capacity can be obtained. That is, by arranging a plurality of compact, high-performance semiconductor chips, a large-capacity, high-performance switching apparatus can be realized. It is rather easy to fabricate compact, high-performance semiconductor chips. Assuming that a total cross-sectional area of all the chips is equal to a cross-sectional area of a conventional single chip, an area of side surfaces can be greatly increased because a plurality of chips are used. Therefore, heat is conducted through the side surfaces of each chip and is sufficiently radiated. For this reason, since the heat can be radiated from the chip without increasing the urging force to the chip, a thermal stress induced in each chip can be easily reduced. As a result, problems of heat radiation and thermal stress experienced upon increasing a current capacity of the switching apparatus can be sufficiently solved. In addition, since the gate electrode wires 38 from the chips 16 are connected with each other at the center of the switching apparatus 10, the lengths of the wires 38 are equal. Therefore, arrival timings of electrical signals transmitted through the wires 38 between the chips 16 and the connection portion do not vary. For this reason, switching characteristics of the switching apparatus 10 can be uniform, and therefore high performance of the apparatus can be obtained.

Figure 6:
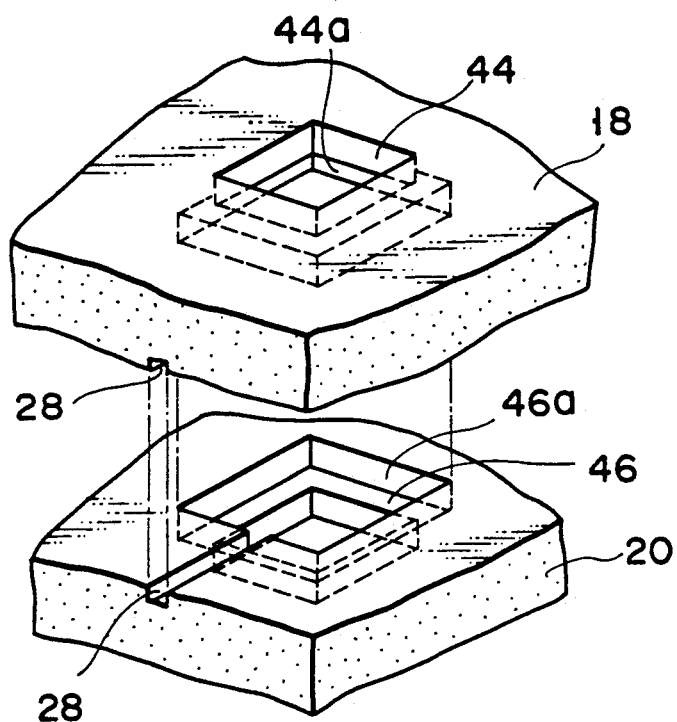
FIG. 6 is a perspective view showing part of a modification of the first embodiment.
Figure 7:
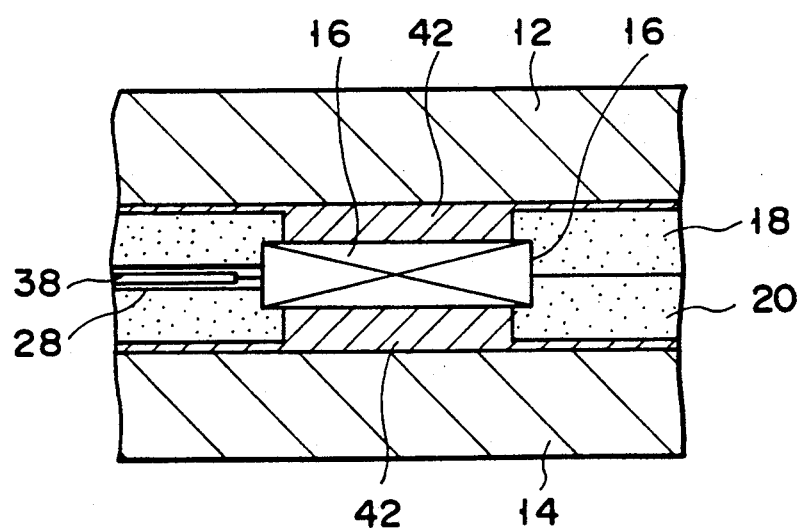
FIG. 7 is a sectional view showing part of the modification.

A modification of the above embodiment will be described below. FIGS. 6 and 7 show a portion of this modification different from that of the above embodiment. In this modification, each of holes 44 and 46 formed in AlN plates 18 and 20, respectively, has a step. That is, the hole 44 (46) is formed larger at a side at which the plates 18 and 20 are brought into contact with each other. Low-melting metals 42 are inserted between a chip 16 and an anode electrode 12 and between the chip 16 and a cathode electrode 14, respectively. The hole 44 (46) has a widely opened portion 44a (46a). When the AlN plates 18 and 20 are brought into contact with each other, a narrow gap is defined between the portion 44a (46a) and the chip 16. A peripheral portion of the chip 16 is clamped by the portions 44a and 46a. The low-melting metals 42 such as lead-tin alloys having high electrical conductivity and thermal conductivity are inserted between the chip 16, the plate 18 and the anode electrode 12, and between the chip 16, the plate 20 and the cathode electrode 14, respectively. The metals 42 at the anode and cathode sides are not in contact with each other. The metals 42 are melted and filled between the electrodes 12 and 14 upon manufacture of the apparatus. The metal 42 is also filled in the narrow gap between the plate 18 (20) and the electrode 12 (14). A groove 28 is formed in each of the plates 18 and 20 A gate electrode wire 38 housed in the grooves 28 is connected to the chip 16. The lengths of the wires 38 from the chips 16 are set equal to each other.

In the above modification, when a current is flowed through the switching apparatus 10, each chip 16 generates heat to melt the low-melting metals 42. Upon melting of the metals 42, the heat generated by the chip 16 is radiated. As a result, a heat resistance between the chip 16 and the electrodes 12 and 14 is largely reduced. In addition, the AlN plates 18 and 20 rapidly conduct the heat from the chip 16 to the electrodes 12 and 14. Therefore, heat radiation characteristics of the switching apparatus 10 are improved. Also, since the metals 42 are melted by the heat, a stress induced in the chip 16 is reduced. Since the plate 18 (20) has a thermal expansion coefficient close to that of the chip 16, the thermal stress induced in the chip 16 can be easily reduced. Furthermore, since the lengths of the gate electrode wires 38 are equally set, arrival timings of electrical signals do not vary. As a result, a large-capacity, high-performance switching apparatus can be provided. In this case, since the heat generated in the semiconductor switching apparatus is sufficiently radiated, no urging force need be applied on the apparatus.

Figure 8:
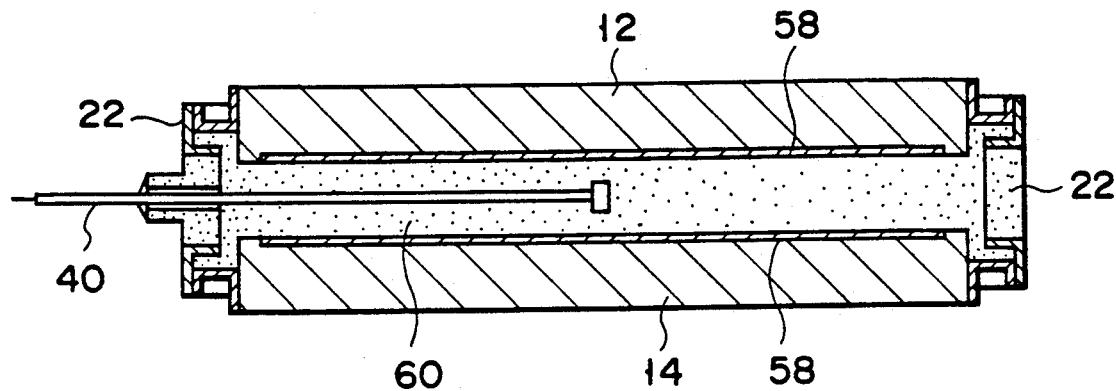
FIG. 8 is a sectional view showing another modification of the first embodiment.
Figure 9:
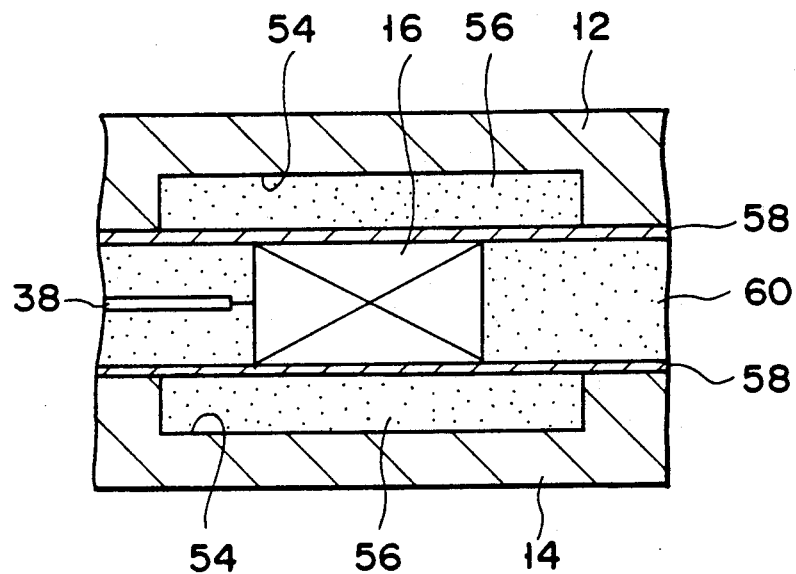
FIG. 9 is a sectional view showing part of another modification.

Another modification of the first embodiment will be described below. FIGS. 8 and 9 show a portion of this modification different from that of the above embodiment. In this modification, each of anode and cathode electrodes 12 and 14 is made of a copper plate. A recess portion 54 is formed in a surface of the electrode 12 (14) facing a chip 16. An AlN plate 56 is located in the recess 54. A thin copper plate 58 is bonded to cover the electrode 12 (14) and the AlN plate 56. In this case, a DBC (direct bonding copper) method is used to strongly bond the AlN plate 56, the electrode 12 (14) and the copper plate 58. A proper thickness of the copper plate 58 to be bonded to the AlN plate 56 is 0.03 to 0.5 mm when a conventional large single chip is to be used. Since a compact chip is usually not broken, the chip can be made thicker, however, the proper thickness is 0.03 to 1.0 mm, and preferably 0.2 to 0.4 mm. The copper plate 58 at the anode electrode side is soldered to one end of the chip 16, and the copper plate 58 at the cathode electrode side is soldered to its other end. An AlN powder 60 is filled in a portion around the chip 16 between the two copper plates 58. A gate electrode wire 38 is connected to each chip 16. The lengths of the wires 38 are set equal to each other.

The DBC method will be briefly described. The DBC method is suitable for welding copper with AlN which are normally difficult to be welded. This method has the following steps. That is, the surface of a copper layer is oxidized at an $O_2$ concentration of 80 to 3,900 ppm and a high temperature of 1,065 to 1,083° C. to form a $CuO_2$ eutectic liquid phase. AlN is reacted with oxygen in an oxygen atmosphere at a high temperature of 1,000° C. or more to form a thin $Al_2O_3$ film. The $CuO_2$ eutectic liquid phase of copper and the $Al_2O_3$ film of AlN are bonded and cooled to form a bonded body of Cu and AlN. In this manner, copper and AlN are strongly bonded to each other.

In the switching apparatus having the above arrangement, the chip 16 is welded to the copper plate 58 and located close to the AlN plate 56 via the copper plate 58. The AlN plate 56 has a thermal expansion coefficient close to that of silicon constituting the chip 16. The chip 16 is in contact with the AlN powder 60. The powder 60 absorbs a force at its outer surface and has high thermal conductivity. Therefore, heat generated from the chip 16 is rapidly conducted to the copper plate 58 via the AlN powder 60 and radiated. In addition, a thermal stress induced in the chip 16 is reduced by the AlN plate 56 and the AlN powder 60. Since the lengths of the gate electrode wires 36 are equally set, arrival timings of electrical signals are equal to each other. Therefore, switching characteristics of the semiconductor switching apparatus can be improved. As a result, also in this large-capacity, high-performance modification, the power semiconductor switching apparatus can be manufactured without applying an urging force to the chip.

Figure 10:
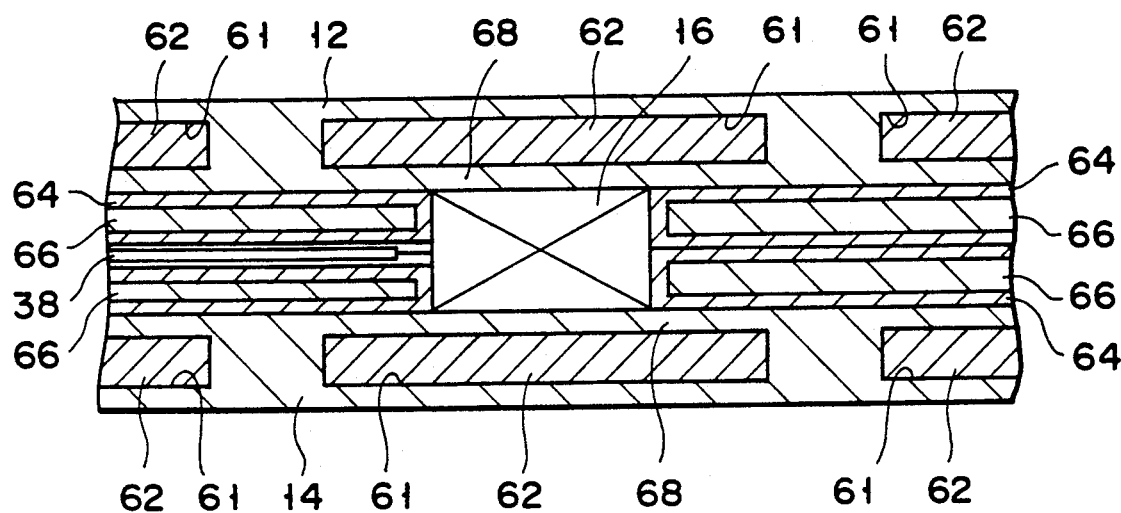
FIG. 10 is a sectional view showing still another modification of the first embodiment.

A third modification of the first embodiment according to the present invention will be described below. FIG. 10 shows a portion of this modification different from that of the above embodiment. A plurality of cavities 61 are formed in anode and cathode electrodes 12 and 14. A silicon plate 62 having a width larger than that of a chip 16 and consisting of a material identical to silicon constituting the chip 16 is embedded in each cavity 61. The semiconductor switching element chip 16 is welded to the electrodes 12 and 14. Two silicon plates 66 each covered with a silicon oxide layer 64 and consisting of silicon identical to that constituting the chip are arranged between the electrodes 12 and 14. The silicon plates 66 are in contact with the chip 16. A gate electrode wire 38 is connected to each chip 16. The lengths of the wires 38 are set equal to each other.

In this switching apparatus, each chip 16 is located adjacent to the silicon plate 62 via the comparatively thin copper layer 68 of the electrode 12 (14). Side surfaces of the chip 16 are adjacent to the silicon plates 66 via the silicon oxide layer 64. Therefore, when a current is flowed through the switching apparatus 10, heat generated in the chip 16 is directly conducted from the welded surfaces to the electrodes 12 and 14. The heat is indirectly conducted from the side surfaces of the chip 16 to the electrodes 12 and 14 via the silicon plates 66. A thermal stress induced in the chip 16 is reduced by the silicon plates 66. In addition, since the lengths of the gate electrode wires 38 are equally set, arrival timings of electrical signals to the chips are equal to each other. Therefore, switching characteristics of the switching apparatus can be improved. As a result, a large-capacity, high-performance semiconductor switching apparatus according to this modification can be manufactured without applying an urging force.

Figure 11:
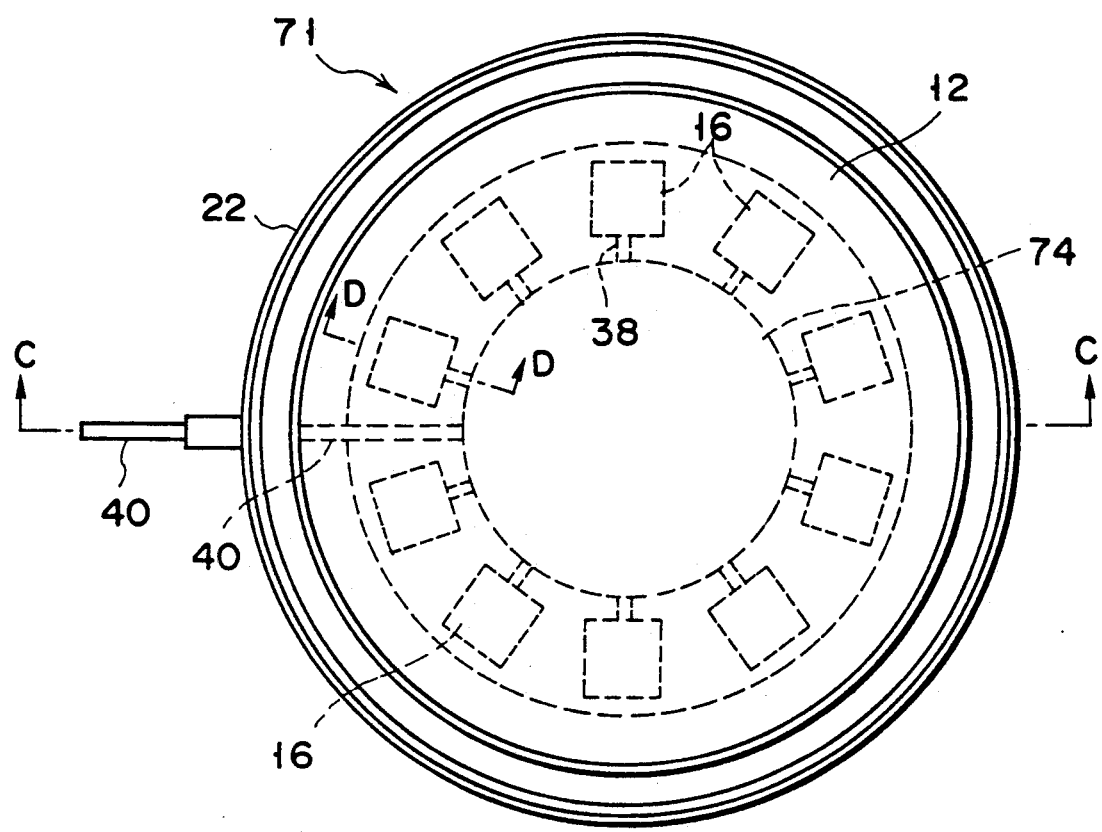
FIG. 11 is a plan view showing a semiconductor switching apparatus according to a second embodiment of the present invention.
Figure 12:
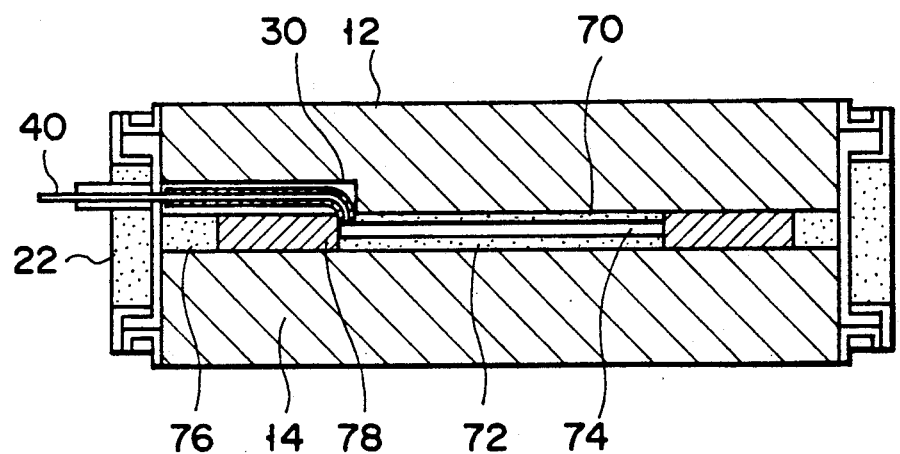
FIG. 12 is a sectional view taken along a line C—C in FIG. 11.

A second embodiment of the present invention will be described below. FIGS. 11 and 12 show a power semiconductor switching apparatus 71 according to the second embodiment. The switching apparatus 71 comprises anode and cathode electrodes 12 and 14 each formed of, e.g., a 10-mm thick, 90-mm diameter disk-like copper plate. The electrodes 12 and 14 are arranged to oppose each other at a predetermined interval. Ten semiconductor switching element chips 16 circularly arranged at equal intervals and insulating rubber 78 located around the chips 16 are arranged between the electrodes 12 and 14. An insulative case 22 covers the circumferential surface of the switching apparatus 71.

Figure 13:
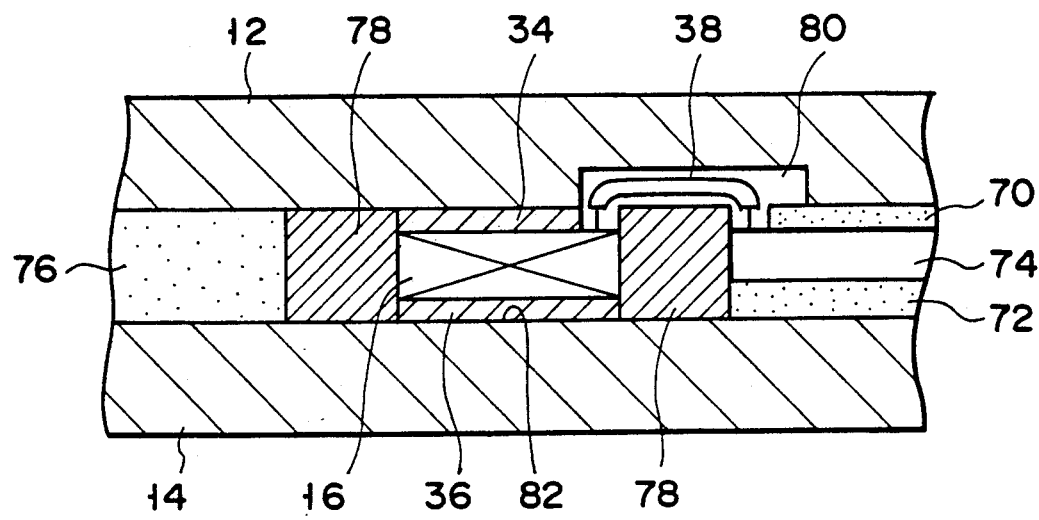
FIG. 13 is a sectional view showing part of the second embodiment taken along a line D—D in FIG. 11.

A structure of the switching apparatus 71 of the second embodiment will be described in detail below. A plurality of disk-like members, i.e., an aluminum nitride (AlN) plate 70 which is in contact with the electrode 12, an aluminum nitride (AlN) plate 72 which is in contact with the electrode 14, and a gate electrode plate 74 located between the AlN plate 70 and 72 are arranged at substantially the center between the electrodes 12 and 14. A groove 30 is formed in the electrode 12. A lead wire 40 is externally connected to the gate electrode plate 74 through the groove 30. An AlN plate 76 is located between the peripheral portions of the electrodes 12 and 14. The insulating rubber 78 is located between the AlN plate 76 and a set of the AlN plates 70 and 72 and the electrode plate 74. As shown in FIG. 13, ten 10-mm side square holes 82 are formed in the insulating rubber 78. The holes 82 are circularly arranged at equal intervals from the electrode plate 74. The chip 16 or the like is arranged in the hole 82. The chip 16 is constituted by an insulated gate type transistor such as a MOSFET or IGBT formed by processing a silicon wafer. A molybdenum plate 34 is in contact with the chip 16 and the electrode 12, and a molybdenum plate 36 is in contact with the chip 16 and the electrode 14. A groove 80 is formed in the electrode 12 and the molybdenum plate 34 to extend between each chip 16 and the gate electrode plate 74. A gate electrode wire 38 is connected between the plate 74 and each chip 16 through the groove 80. The lengths of the wires 38 are set equal to each other. A total thickness of the molybdenum plates 34 and 36 and the chip 16 is slightly smaller than the thickness of the rubber 78.

In the power semiconductor switching apparatus having the above arrangement, urging forces are externally applied to the electrodes 12 and 14. The above members are brought into contact with each other by these urging forces. A thermal expansion coefficient of the plate 34 (36) is close to that of silicon. Therefore, the plate 34 (36) reduces a thermal stress induced in a diameter direction of the chip 16 due to a difference between thermal expansion coefficients of the electrode 12 (14) and the chip 16. Each of the AlN plates 70, 72 and 76 has a thermal expansion coefficient close to that of silicon, and therefore reduces a thermal stress induced in a diameter direction of the chip 16. Each of the AlN plates 70, 72 and 76 is insulative and has high thermal conductivity. Therefore, the plates 70, 72 and 76 insulate the anode and cathode electrodes 12 and 14 from each other to reduce heat resistances induced between the outer surfaces of the chip 16 and the electrodes 12 and 14. In addition, the plates 70, 72 and 76 reduce a temperature difference between the electrodes 12 and 14. Therefore, the temperature of the overall switching apparatus is uniformed.

The switching apparatus 71 adopts the insulating rubber 78. Without using the rubber 78, however, the sizes of the surrounding AlN plates may be increased. In the switching apparatus 71, urging forces are externally applied to the electrodes 12 and 14. Without applying the urging forces, however, the anode and cathode electrodes 12 and 14 may be soldered to the molybdenum plates 34 and 36, respectively. In the switching apparatus 71, if the diameter of the gate electrode plate 74 is increased to decrease the interval to the chip 16, an effect of radiating the heat generated in the chip 16 is improved, and an effect of reducing the thermal stress induced therein is also improved. Since the lengths of the gate electrode wires 38 are equally set, arrival timings of currents to the chips are equal to each other. Therefore, when the interval between the electrode plate 74 and the chip 16 is decreased, the length of the wire 38 is decreased. Therefore, since the current can arrive the chip at an earlier timing, switching characteristics of the switching apparatus 71 can be improved.

Figure 14:
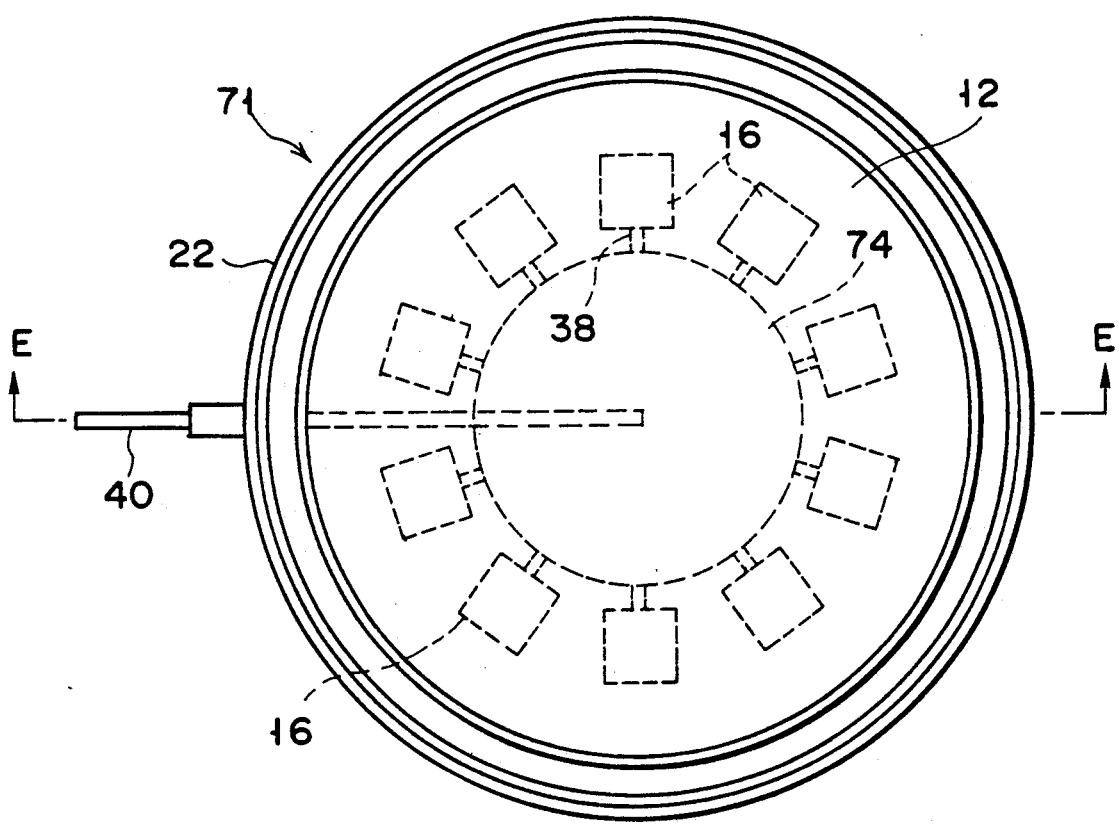
FIG. 14 is a plan view showing a modification of the second embodiment.
Figure 15:
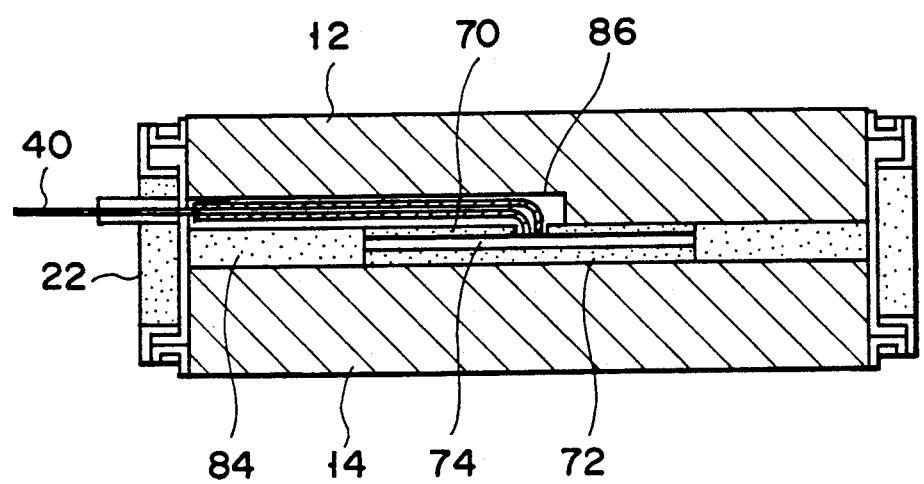
FIG. 15 is a sectional view taken along a line E—E in FIG. 11.

A modification of the second embodiment will be described below. As shown in FIGS. 14 and 15, in this modification, a lead wire 40 is not connected to the peripheral portion but to the central portion of a gate electrode plate 74. In addition, an AlN plate 84 is used in place of insulating rubber 78. Ten square holes 82 are formed in the AlN plate 84. A groove 86 for guiding the lead wire 40 is formed in an anode electrode 12. The other members are similarly arranged as in the second embodiment.

In this modification, since the lead wire 40 is connected to the center of the gate electrode plate 74, distances between the connection portion to chips 16 are set equal to each other. Therefore, arrival timings of currents from the connection portion to the chips through gate electrode wires are set equal with higher precision and switching characteristics of the semiconductor switching apparatus are further improved.

In addition to the above modification various modifications of the second embodiment can be made. For example, in place of the AlN plate, alumina, powdery aluminum nitride or silicon covered with silicon oxide can be used. In the above embodiment, the chips are circularly arranged. The chips, however, may be arranged in any shape as long as they are arranged in parallel with each other. In this case, if the lengths of the gate electrode wires are equally set, switching characteristics of the semiconductor switching apparatus can be improved. The shape of the gate electrode plate is not limited to a disk but may be any shape such as a star.

According to the above second embodiment, a large-capacity, high-performance semiconductor switching apparatus is realized.

Figure 16:
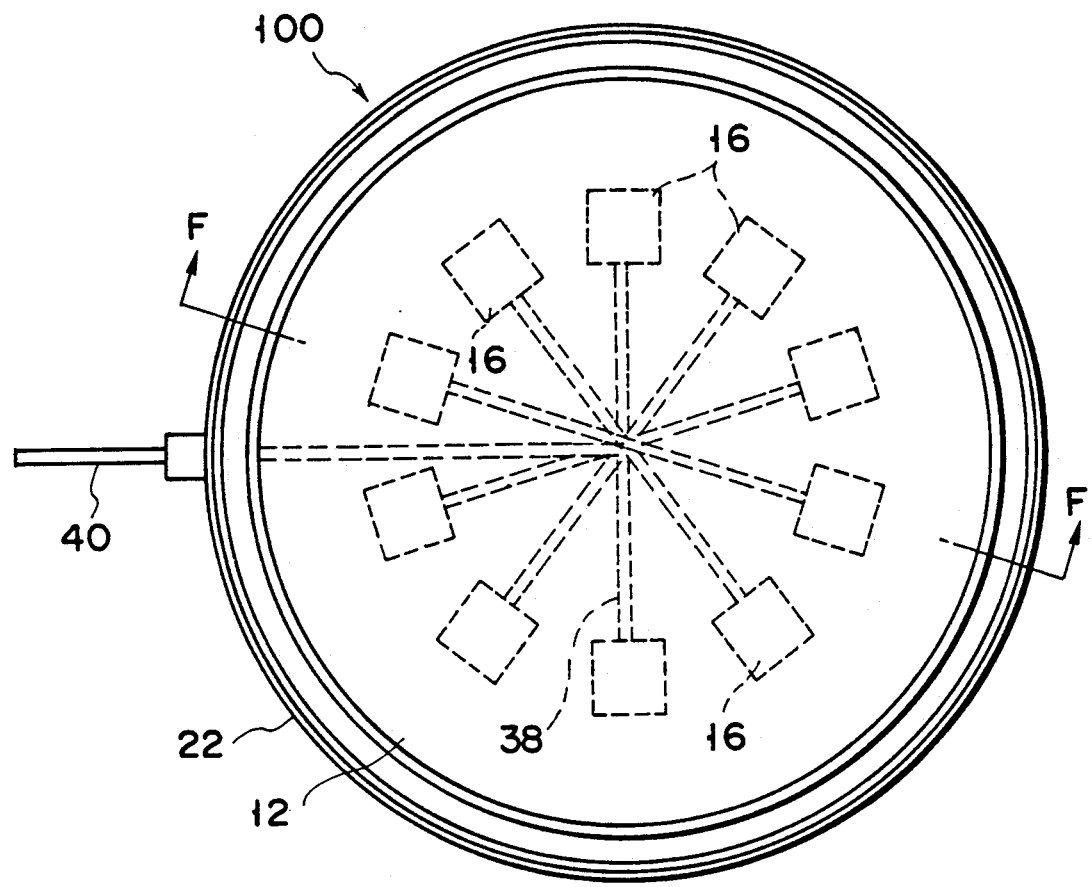
FIG. 16 is a plan view showing a semiconductor switching apparatus according to a third embodiment of the present invention.
Figure 17:
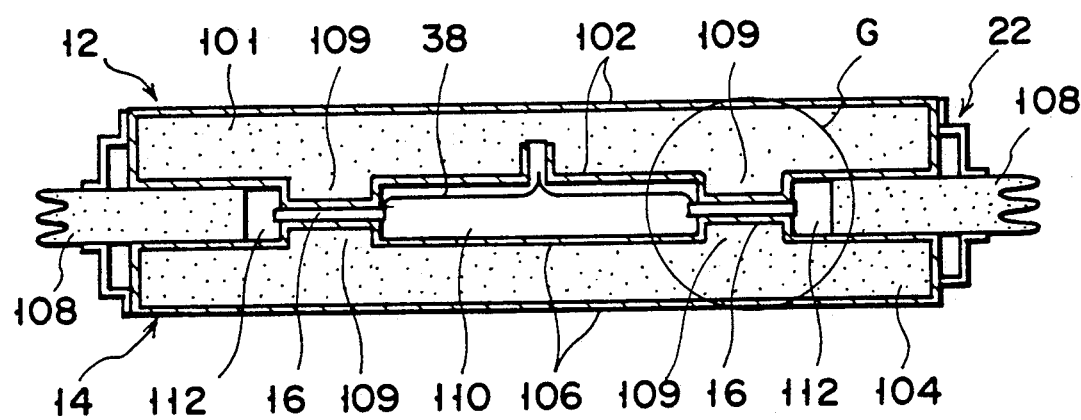
FIG. 17 is a sectional view taken along a line F—F in FIG. 16.

A third embodiment of the present invention will be described below. FIGS. 16 and 17 show a power semiconductor switching apparatus 100 according to the third embodiment of the present invention. The switching apparatus 100 comprises anode and cathode electrodes 12 and 14. The electrode 12 is formed by covering an aluminum nitride (AlN) plate 101 with a copper foil 102. The copper foil 102 is bonded to the AlN plate 101 by the DBC method. Similarly, the electrode 14 is formed by covering an AlN plate 104 with a copper foil 106. The copper foil 106 is bonded to the AlN plate 104 by the DBC method. The electrodes 12 and 14 are arranged to oppose each other at a predetermined interval. Ten square semiconductor switching element chips 16 are arranged in a gap defined between the electrodes 12 and 14. An AlN plate 108 is located at a peripheral portion of the gap between the electrodes 12 and 14 of the switching apparatus 100. A gate electrode wire 38 is connected to each chip 16. The electrode wires 38 are connected to each other at a central portion of the apparatus 100. An insulative case 22 covers the circumferential surface of the apparatus 100.

Figure 18:
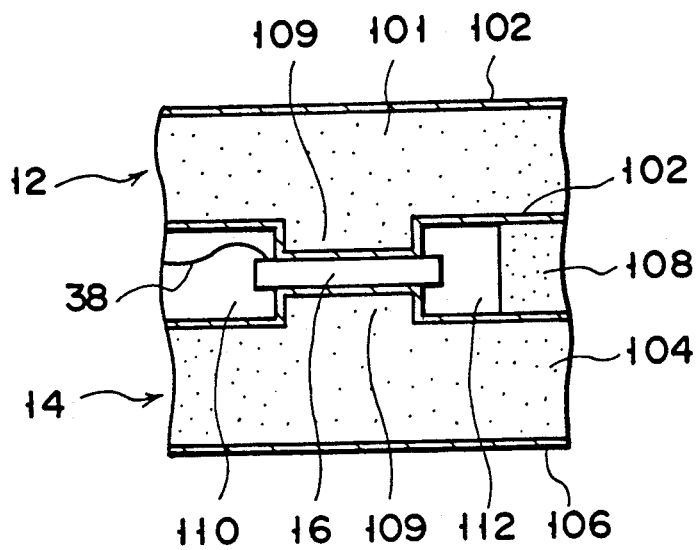
FIG. 18 is a perspective view showing part G shown in FIG. 17.

The switching apparatus 100 will be described in detail below with reference to FIGS. 17 and 18. Each of the electrodes 12 and 14 has a projection 109 to be in contact with the chip 16. Each of the copper foils 102 and 106 has a thickness of 0.03 to 1.0 mm and preferably 0.2 to 0.4 mm, and is soldered to the chip 16. A groove 110 for housing the gate electrode wire 38 is formed in the electrode 12 (14). A gap 112 for receiving the AlN plate 108 is defined between the peripheral portions of the electrodes 12 and 14. Each chip 16 is, e.g., a 10-mm side square plate. The gate electrode wire 38 is housed in the groove 110. The lengths of the wires 38 from the chips 16 are set equal to each other.

In the power semiconductor switching apparatus 100 having the above arrangement, each AlN plate has a thermal expansion coefficient close to that of silicon constituting each chip. Therefore, when a current is flowed through the switching apparatus 100, the AlN plates 101, 104 and 108 reduce a stress induced due to heat generated from each chip 16. In addition, each of the plates 101, 104 and 108 is insulative and has high thermal conductivity. Therefore, the plates 101, 104 and 108 insulate the electrodes 12 and 14 from each other and reduce heat resistances between the chip 16 and the electrodes 12 and 14. A thermal expansion coefficient of copper is larger than that of silicon constituting each chip 16. For this reason, a strain caused by a thermal stress induced between each chip 16 and the electrode 12 (14) due to heat generated in the chip 16 is absorbed by the copper foil 102 (106) of the electrode 12 (14). Therefore, the chip 16 is not adversely affected by a strain. Since the AlN plate 108 is arranged in the gap 112 between the electrodes 12 and 14, a heat resistance of the switching apparatus can be decreased while electrical insulation between the electrodes 12 and 14 is assured. For this reason, the temperature of the overall switching apparatus 100 can be substantially uniformed. Since the lengths of the gate electrode wires 38 are equally set, arrival timings of currents from the connection portion of the wires 38 to the chips 16 are substantially equal to each other. Therefore, switching characteristics of the switching apparatus can be improved. Since the electrodes 12 and 14 are soldered to the chip 16, no urging force need be applied between the electrodes 12 and 14. Therefore, the chip 16 is not broken because no urging force is applied thereto. As a result, a ratio of defective products in the manufacture of the switching apparatuses can be reduced. For this reason, quality control can be easily performed. In addition, a compact, high-performance chip can be fabricated more easily than a large chip. Therefore, since the switching apparatus employs a plurality of compact, high-performance chips, it can be easily manufactured. Also, the switching apparatus can have a large current capacity and high performance without increasing its size.

Figure 19:
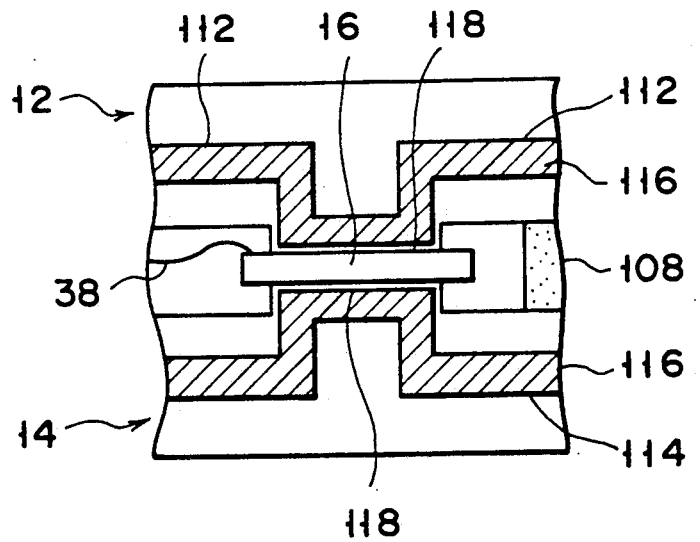
FIG. 19 is a plan view showing a modification of the third embodiment.

A modification of the third embodiment will be described below. As shown in FIG. 19, this modification comprises anode and cathode electrodes 12 and 14 each formed of copper. Cavities 112 and 114 are formed in the electrodes 12 and 14, respectively. A low-melting metal 116 such as a lead-tin alloy having high electrical conductivity and thermal conductivity is filled in each of the cavities 112 and 114. A portion 118 of the electrode 12 (14) in contact with a chip 16 is formed into a very thin copper foil. An arrangement of the other portions is similar to that of the third embodiment.

In the switching apparatus having the above arrangement according to this modification, heat generated by the chip 16 is conducted to the low-melting metal 116 via the copper foil. The metal 116 is melted by this heat. Therefore, since the heat is absorbed by the metal 116, heat radiation characteristics of the switching apparatus can be further improved. Since the heat radiating characteristics are improved, a stress caused by heat is reduced by the copper foils of the electrodes 12 and 14. In addition, heat resistances between the chip 16 and the electrodes 12 and 14 of the switching apparatus can be largely reduced. Since the lengths of gate electrode wires are equally set, arrival timings of currents become equal to each other. Therefore, switching characteristics of the switching apparatus can be improved. As a result, a large-capacity, high-performance semiconductor switching apparatus is realized.

Figure 20:
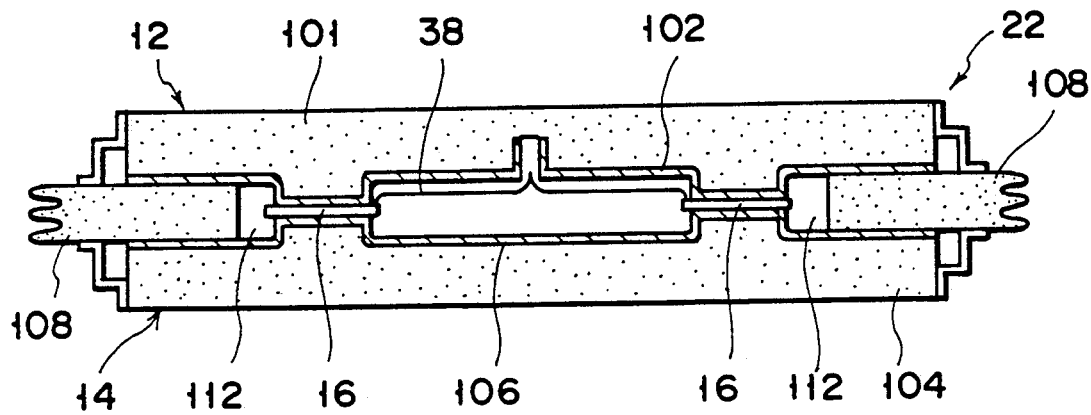
FIG. 20 is a sectional view showing another modification of the third embodiment.

Another modification of the third embodiment will be described below. As shown in FIG. 20, in this modification, a copper foil 102 of an anode electrode 12 and a copper foil 106 of a cathode electrode 14 are formed on only surfaces to be in contact with a chip 16. The copper foils 102 and 106 are bonded to AlN plates 101 and 104, respectively, by the DBC method. An arrangement of the other members is similar to that of the third embodiment.

In the switching apparatus having the above arrangement, electrical insulation can be easily obtained because no copper foil is formed on the outer surfaces. Since the AlN plate has high thermal conductivity, heat generated from each chip can be sufficiently radiated from the AlN plates 101 and 104 of the electrodes 12 and 14, respectively.

In the above third embodiment, the copper foil is bonded to the electrode. However, for example, an electrically conductive material such as an aluminum foil or molybdenum foil can be equally used. In addition, such an electrically conductive material can be formed by deposition. A deposition layer of this electrically conductive material preferably has a thickness of about 0.05 to 0.5 mm when it is soldered to the chip. If the foil has a thickness in this range, it deforms more easily than the chip by a stress induced due to heat from the chip. Therefore, destruction or the like of the chip caused by the thermal stress can be prevented. Also, one of the anode and cathode electrodes may be formed as described above, while the other is formed by shaping an electrically conductive material into a plate or thin film. In this case, the switching apparatus is put into an oil to obtain electrical insulation and used. In the above embodiment, a plurality of chips are circularly arranged. The chips, however, can be parallelly arranged in a network manner. The lengths of the gate electrode wires connected to the respective chips are preferably set equal to each other in order to improve switching characteristics.

Figure 21:
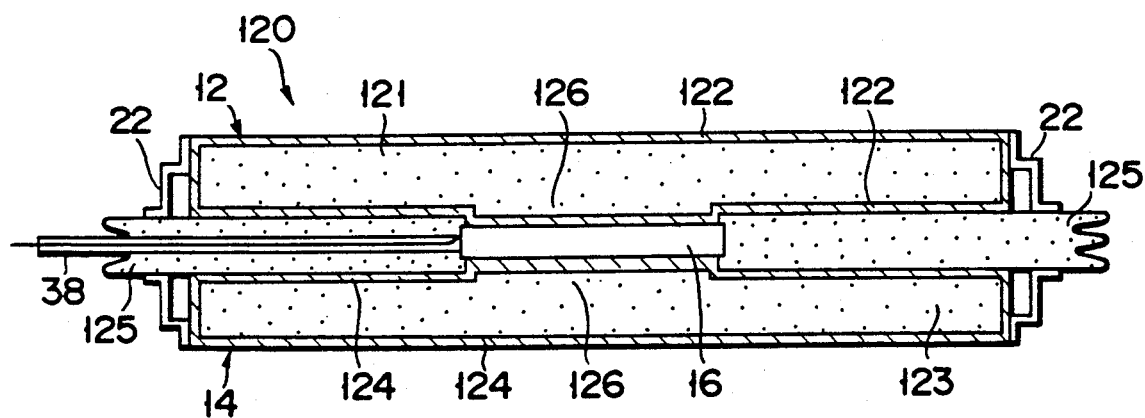
FIG. 21 is a sectional view showing a semiconductor switching apparatus according to a fourth embodiment of the present invention.

A fourth embodiment of the present invention will be described below. FIG. 21 shows a power semiconductor switching apparatus 120. The switching apparatus 120 comprises anode and cathode electrodes 12 and 14. The electrode 12 is formed by covering an aluminum nitride (AlN) plate 121 with a copper foil 122. Similarly, the electrode 14 is formed by covering an AlN plate 123 with a copper foil 124. The copper foils 122, 124 are bonded to the AlN plates 121, 123 by the DBC method, respectively. The electrodes 12 and 14 are arranged to oppose each other at a predetermined interval. A square semiconductor switching element chip 16 are arranged in a gap defined between the electrodes 12 and 14. Each of the copper foils 122, 124 has a thickness of 0.03 to 1.0 mm and preferably 0.2 to 0.4 mm, and is soldered to the chip 16. Each of electrodes 12 and 14 has a projection 126 to be in contact with the chip 16. An AlN plate 125 is located at a peripheral portion of the gap between the electrodes 12 and 14. A gate electrode wire 38 connected to the chip 16 is housed in a groove formed in the electrodes 12 and 14. An insulative case 22 covers the circumferential surface of the apparatus 120.

The power semiconductor switching apparatus 120 having the above arrangement has the only one chip 16. The chip 16 is constituted by an insulated gate type transistor such as a MOSFET or IGBT formed by processing a silicon wafer. When a current is flowed through the switching apparatus 120, the chip 16 generates heat. The AlN plates have a thermal expansion coefficient close to that of silicon, are insulative and have good thermal conductivity. Therefore, the AlN plates 121, 123 radiate the heat generated by the chip 16 through the copper foils 122, 124 to reduce a thermal stress in a diameter direction. In addition, the plates 121, 123 reduce a heat resistance between the outer surface of the chip 16 and the electrodes 12 and 14. The AlN plate 125 radiates the heat generated by the chip 16 to reduce a thermal stress in a diameter direction. Therefore, high-performance switching apparatus which has only one semiconductor chip can be realized. In this embodiment, since heat is conducted through the side surface of the chip, heat is sufficiently radiated and a thermal stress induced in a chip can be easily reduced. Since the chip is soldered to the anode and cathode electrodes, the chip is not broken by an urging force. In addition to the above embodiment, various modification can be made. In plate of the AlN plate 125, powdery aluminum nitride can ba used. By powdery aluminum nitride, a thermal stress induced in a chip can be easily reduced. As a result, high-performance switching apparatus can be realized.

Figure 22:
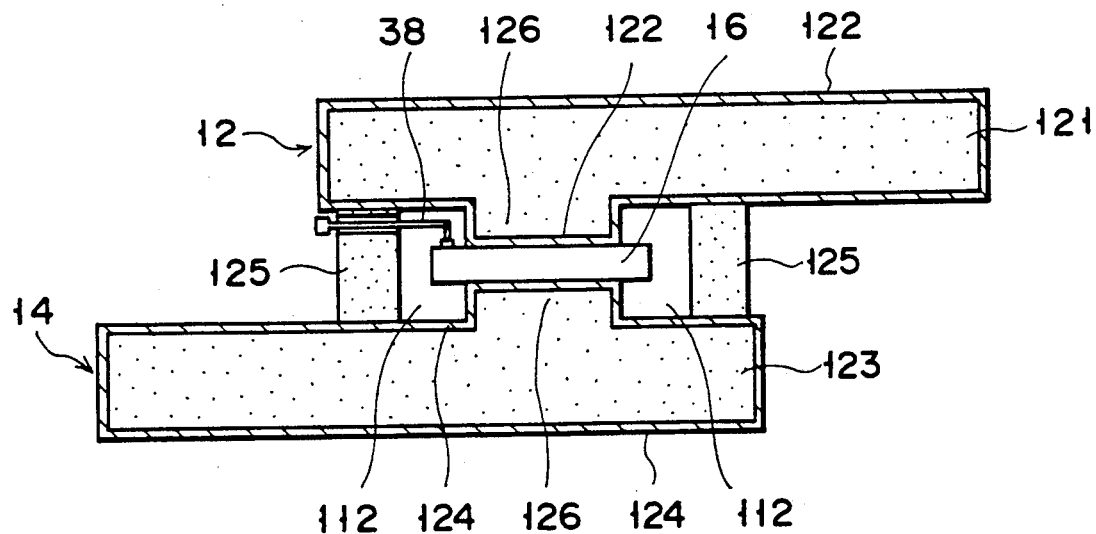
FIG. 22 is a sectional view showing still another modification of the fourth embodiment.

A modification of the fourth embodiment will be described below. As shown in FIG. 22, this modification uses anode and cathode electrodes 12 and 14 having different shapes. An AlN plate 121 is located inside the anode electrode 12. A copper foil 122 covers the AlN plate 121. The foil 122 is bonded to the plate 121 by the DBC method. An AlN plate 123 is located inside the cathode electrode 14. A copper foil 124 covers the AlN plate 123. The foil 124 is bonded to the plate 123 by the DBC method. A chip 16 is arranged between the electrodes 12 and 14. A gate electrode wire 38 is connected to the chip 16. A projection 126 is formed at a portion of the electrode 12 (14) to be brought into contact with the chip 16. A gap 112 is defined around the chip 16 between the electrodes 12 and 14. An AlN plate 125 is inserted in the gap 112. The gate electrode wire 38 from each chip 16 is inserted through a hole formed in the plate 125.

In the switching apparatus having the above arrangement, since an area of the externally exposed surface of the electrode is wide, an electrical connection can be easily made from the foil.

Figure 23:
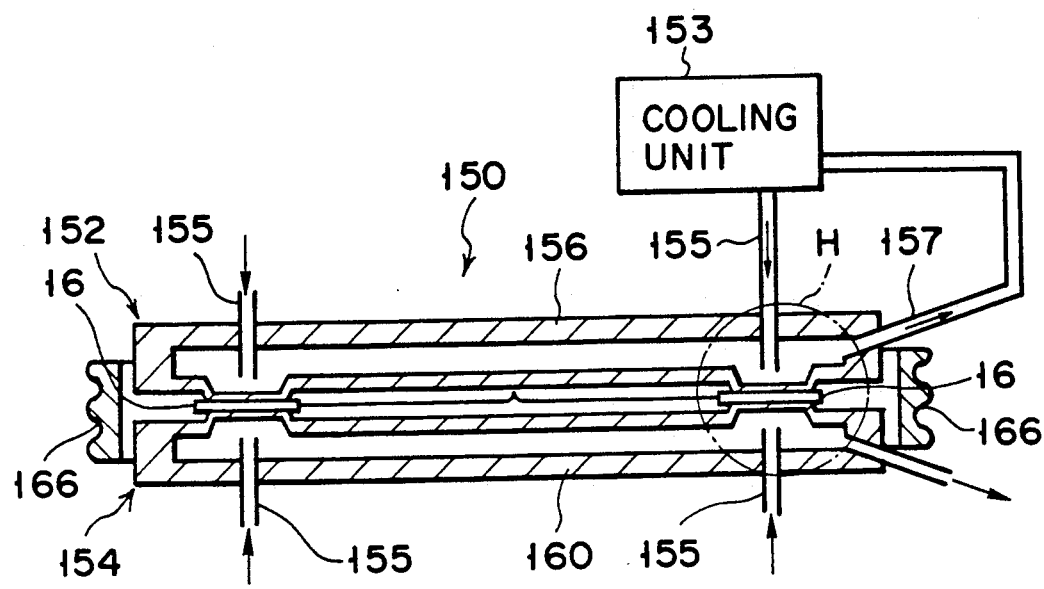
FIG. 23 is a sectional view showing a semiconductor switching apparatus according to a fifth embodiment of the present invention.
Figure 24:
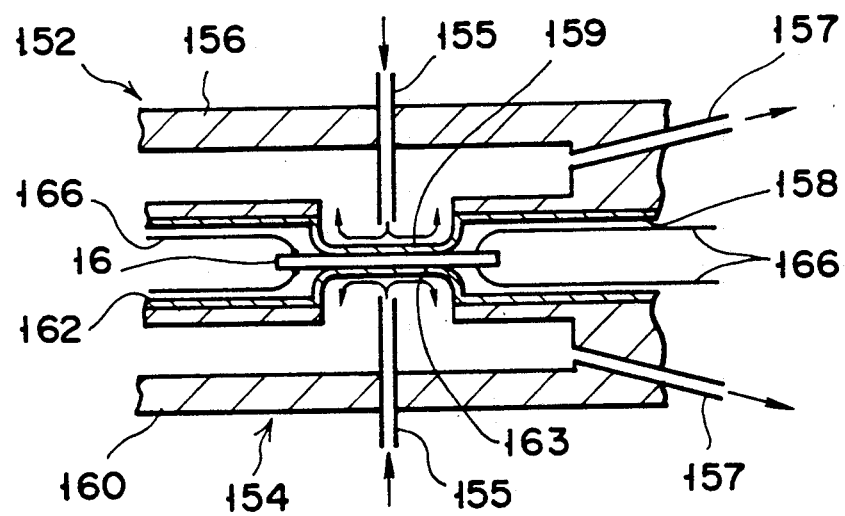
FIG. 24 is a sectional view showing part H shown in FIG. 23.

A fifth embodiment of the present invention will be described below. As shown in FIGS. 23 and 24, a semiconductor switching apparatus 150 comprises anode and cathode electrodes 152 and 154. The anode electrode 152 has an AlN plate 156 and a thin copper plate 158. The copper plate 158 is bonded to the AlN plate 156 by the DBC method. The thickness of the plate 158 is 0.03 to 1.0 mm, and preferably 0.2 to 0.4 mm. A cavity is formed in the electrode 152. In this cavity, part of the AlN plate 156 is notched, and a portion of the copper plate 158 near the notched portion projects outward to form a projection 159. The cathode electrode 154 has an AlN plate 160 and a thin copper plate 162. The copper plate 162 is bonded to the AlN plate 160 by the DBC method. The thickness of the plate 162 is 0.03 to 1.0 mm, and preferably 0.2 to 0.4 mm. A cavity is formed in the electrode 154. In this cavity, part of the AlN plate 160 is notched, and a portion of the copper plate 162 near the notched portion projects outward to from a projection 163. Pipes 155 open toward the projections 159 and 163 are externally inserted in the electrodes 152 and 154, respectively. Pipes 157 open outward are inserted in side surfaces of the electrodes 152 and 154. A cooling unit 153 is connected to the pipes 155 and 157. An insulative coolant such as a freorene solution is filled in the cavities of the electrodes 152 and 154. The freorene solution is injected from a nozzle of each pipe 155 to an inner portion of the projection 159 (163) of the copper plate 158 (162). Thereafter, the freorene solution is recovered through each pipe 157. A semiconductor switching element chip 16 is located between the projections 159 and 163 of the copper plates 158 and 162 of the electrodes 152 and 154, respectively. The chip 16 is soldered to the projections 159 and 163 of the plates 158 and 162. A gate electrode wire 166 is connected to the chip 16. The lengths of the wires 166 are set equal to each other. The wires 166 are connected at a central portion of the switching apparatus 150. A lead wire (not shown) extending outward is connected to this connection portion. An insulative case 166 covers the circumferential surfaces of the electrodes 152 and 154.

In the semiconductor switching apparatus having the above arrangement, the freorene solution supplied from the cooling unit 153 is injected from the nozzles of the pipes 155 to the recess portions 159 and 163 respectively of the copper plates 158 and 162 in contact with the chip 16. For this reason, since heat generated in the chip 16 when a current is flowed through the switching apparatus 150 is absorbed by the freorene solution, the chip can be sufficiently cooled. Therefore, in this semiconductor switching apparatus, a current capacity of the chip can be sufficiently increased, or the number of chips to be used can be increased. As a result, a large capacity of the semiconductor switching apparatus can be realized. In addition, since the lengths of gate electrode wires to be connected to the chips are equally set, arrival timings of currents to the chips are equal to each other. Therefore, switching characteristics of the semiconductor switching apparatus can be improved. As a result, high performance of the semiconductor switching apparatus can be realized.

We claim:

1. A power semiconductor switching apparatus comprising:
   an anode electrode serving as a heat sink;
   a cathode electrode serving as a heat sink;
   a plurality of parallel semiconductor switching element chips arranged between said anode and cathode electrodes, the number of said semiconductor switching element chips being set such that a total of rated currents flowing through the chips becomes equal to or larger than a rated current of said switching apparatus;
   a plurality of gate electrode wires connected to each of said chips and
   reducing and conducting means for reducing a thermal stress induced in said semiconductor switching element chips and for conducting heat from surfaces of said chips to said anode and cathode electrodes, said reducing and conducting means being located around said chips.

2. A power semiconductors switching apparatus comprising:
   an anode electrode serving as a heat sink;
   a cathode electrode serving as a heat sink;
   a plurality of parallel semiconductor switching element chips arranged between said anode and cathode electrodes, the number of said semiconductor switching element chips being set such that a total of rated currents flowing through the chips becomes equal to or larger than a rated current of said switching apparatus;
   a plurality of gate electrode wires connected to each of said chips; and
   reducing and radiating means for reducing a thermal stress induced in said semiconductor switching element chips and for radiating heat from surfaces of said chips, said reducing and said radiating means being located around said chips.

3. A power semiconductor switching apparatus comprising:
   an anode electrode serving as a heat sink;
   a cathode electrode serving as a heat sink;
   a plurality of parallel semiconductor switching element chips arranged between said anode and cathode electrodes, the number of said semiconductor switching element chips being set such that a total of rated currents flowing through the chips becomes equal to or larger than a rated current of said switching apparatus;
   a plurality of gate electrode wires connected to each of said chips; and
   reducing and conducting means for reducing a thermal stress induced in said chips and for conducting heat from said chips to said electrodes, said reducing and conducting means being located at at least one of said anode and cathode electrodes.

4. An apparatus according to claims 1 or 2 or 3, wherein an electric potential is applied to said anode and cathode electrodes.

5. An apparatus according to claims 1, or 2 or 3 wherein said semiconductor switching element chips are circularly arranged at equal intervals between said anode and cathode electrodes.

6. An apparatus according to claims 1 or 2 or 3, wherein each of said semiconductor switching element chips in an insulated gate type transistor.

7. An apparatus according to claims 1 or 3, wherein said reducing and conducting means includes a metal layer between said semiconductor switching element chips and said anode and cathode electrodes.

8. An apparatus according to claims 1 or 3, wherein said reducing and conducting means includes one of an aluminum nitride and silicon layer buried in said anode and cathode electrodes.

9. An apparatus according to claims 1 or 3, wherein said reducing and conducting means includes an aluminum nitride layer.

10. An apparatus according to claim 9, wherein said aluminum nitride layer has at least one hole for housing each of said semiconductor switching element chips, said hole having a step.

11. An apparatus according to claims 1 or 3, wherein said reducing and conducting means includes a powdery aluminum nitride layer.

12. An apparatus according to claims 1 or 3, wherein said reducing and conducting means includes a silicon layer covered with silicon oxide.

13. An apparatus according to claims 1 or 2 or 3, wherein each of said semiconductor switching element chips comprises silicon.

14. An apparatus according to claims 1 or 3, wherein said reducing and conducting means includes an electrically conductive material layer.

15. An apparatus according to claims 1, 2 or 3, wherein each of said anode and cathode electrodes comprises an aluminum nitride plate covered with an electrically conductive material layer.

16. An apparatus according to claims 1, 2 or 3, wherein at least one silicon plate is arranged in each of said anode and cathode electrodes.

17. An apparatus according to claims 1, 2 or 3, wherein said gate electrode wires have equal lengths from said chips and are connected with each other.

18. An apparatus according to claim 1, wherein at least one of said anode and cathode electrodes has means for reducing a thermal stress induced in said chips and for conducting heat from said chips to said electrodes.

19. An apparatus according to claim 18, wherein an electrically conductive material connected to said chips and having a thickness allowing said electrically conductive material to deform more easily than said chips is located between said means and said chips.

20. An apparatus according to claim 18, wherein said means includes one of aluminum nitride and a metal.

21. An apparatus according to claim 18, wherein each of said anode and cathode electrodes comprises an aluminum nitride plate covered with an electrically conductive material.

22. An apparatus according to claims 1, 2 or 3 wherein each of said anode and cathode electrodes comprises an electrically conductive material, a cavity being formed in at least one of said electrodes, and a contact portion of each of said electrodes which is in contact with each of said chips, and which has a thickness allowing said contact portion to deform more easily than said chip.

23. An apparatus according to claim 22, wherein a metal fills said cavity.

24. An apparatus according to claim 22, wherein said electrically conductive material is soldered to said chips.

25. An apparatus according to claim 22, wherein said electrically conductive material is formed into one of a thin foil and a thin film obtained by vapor deposition.

26. A power semiconductor switching apparatus comprising:
an anode electrode serving as a heat sink;
a cathode electrode serving as a heat sink;
a plurality of parallel semiconductor switching element chips arranged between said anode and cathode electrodes, the number of said semiconductor switching element chips being set such that a total of rated currents flowing through the chips becomes equal to or larger than a rated current of said switching apparatus;
a gate electrode plate arranged between said anode and cathode electrodes and connected to an external lead wire;
a gate electrode wire connected to each of said chips and said gate electrode plate; and
reducing and conducting means for reducing a thermal stress induced in said chips and for conducting heat from surfaces of said chips to said anode and cathode electrode, said reducing and conducting means being located around said semiconductor element chips.

27. A power semiconductor switching apparatus comprising:
an anode electrode serving as a heat sink;
a cathode electrode serving as a heat sink;
a plurality of parallel semiconductor switching element chips arranged between said anode and cathode electrodes, the number of said semiconductor switching element chips being set such that a total of rated currents flowing through the chips becomes equal to or larger than a rated current of said switching apparatus;
a gate electrode plate arranged between said anode and cathode electrodes and connected to an external lead wire;
a gate electrode wire connected to each of said chips and said gate electrode plate; and
reducing and radiating means for reducing a thermal stress induced in said chips and for radiating heat from surfaces of said chips, said reducing and radiating means being located around said semiconductor element chips.

28. An apparatus according to claims 26 or 27, wherein each of said semiconductor switching element chips comprises silicon.

29. An apparatus according to claims 26 or 27, wherein means for performing electrical insulation and conducting heat is located between said gate electrode plate and said anode and cathode electrodes.

30. An apparatus according to claims 26 or 27, wherein all of said gate electrode wires have equal lengths.

31. An apparatus according to claim 26, wherein said reducing and conducting means includes an aluminum nitride layer.

32. An apparatus according to claim 26, wherein said reducing and conducting means includes powdery aluminum nitride layers.

33. An apparatus according to claim 26, wherein said reducing and conducting means includes a silicon layer covered with a silicon oxide layer.

34. An apparatus according to claims 26 or 27, wherein said gate electrode plate is formed of a disk-like member, said semiconductor switching element chips being circularly arranged at equal intervals with a predetermined interval from a periphery of said electrode plate.

35. An apparatus according to claims 26 or 27, wherein a lead wire is connected to a central portion of said gate electrode plate.

36. An apparatus according to claims 26 or 27, wherein each of said semiconductor switching element chips is a gate insulated type transistor.

37. An apparatus according to claim 26, wherein said reducing and conducting means has an electrically conductive material layer.

38. An apparatus according to claims 26 or 27, wherein an electrical force is applied between said anode and cathode electrodes.

39. A power semiconductor switching apparatus comprising:
an anode electrode and a cathode electrode, at least one of which has a cavity therein;
a plurality of parallel semiconductor switching element chips arranged between said anode and cathode electrodes;
a gate electrode wire connected to each of said chips; and
cooling means for externally circulating a coolant in the cavities of said anode and cathode electrodes, said coolant being jetted to surfaces of said chips for cooling.

40. An apparatus according to claim 39, wherein the number of said semiconductor switching element chips is set such that a total rated current of said chips becomes equal to or larger than a rated current required for said switching apparatus.

41. An apparatus according to claim 39, wherein said semiconductor switching element chips are circularly arranged at equal intervals between said anode and cathode electrodes.

42. An apparatus according to claim 39, wherein said cooling means for circulating the coolant includes a cooling unit for cooling the coolant and pipes connected to said electrodes.

43. An apparatus according to claim 39, wherein each of said anode and cathode electrodes comprises an AlN plate having a cavity therein and a copper plate.

44. An apparatus according to claim 43, wherein a portion of said copper plate of each of said electrodes to be brought into contact with said chip projects outward to form a projection, and a hole is formed in said AlN plate at a portion close to said projection.

45. An apparatus according to claim 43, wherein the coolant is directly injected toward said projection of said copper plate from outside each of said electrodes through the cavity of said AlN plate.

46. An apparatus according to claim 39, wherein each of said semiconductor switching element chips is selected from insulated gate type transistors including composite type.

47. An apparatus according to claim 39, wherein each of said semiconductor switching element chips comprises silicon.

48. An apparatus according to claim 39, wherein said gate electrode wires have equal lengths and are connected with each other.

49. An apparatus according to claim 39, wherein said cooling means includes a cooling unit and pipes, each of said pipes being connected to a corresponding electrode such that the coolant from said cooling unit is directly injected toward said projection through the cavity of said electrode.

50. A power semiconductor switching apparatus comprising:
an anode electrode serving as a heat sink;
a cathode electrode serving as a heat sink; at least one semiconductor switching element chip arranged between said anode and cathode electrodes;
a gate electrode wire connected to said chip;
reducing and radiating means for reducing a thermal stress induced in said chip and for radiating heat from surface of said chip.

51. An apparatus according to claim 50, wherein said at least one semiconductor switching element chip is an insulated gate type transistor.

52. An apparatus according to claim 50, wherein said means includes an aluminum nitride layer.

53. An apparatus according to claim 50, wherein each of said anode and cathode electrodes comprises an aluminum nitride plate covered with an electrically conductive material layer.

54. An apparatus according to claim 50, wherein said means includes a powdery aluminum nitride layer.

55. An apparatus according to claim 50, wherein said at least one semiconductor switching element chip comprises silicon.

56. An apparatus according to claim 50, wherein each of said anode and cathode electrodes is formed so that one end portion in section of each of said electrodes is longer than the other end portion and the long portions of said electrodes arranged symmetrically and in opposite directions from each other.

57. An apparatus according to claim 50, wherein said means includes a metal layer.

58. An apparatus according to claim 53, wherein said electrically conductive material is soldered to said chip.

59. An apparatus according to claim 53, wherein said electrically conductive material is formed into one of thin foil or and a thin film obtained by vapor deposition.

60. An apparatus according to claim 2, wherein said reducing and radiating means includes a metal layer between said semiconductor switching element chips and said anode and cathode electrodes.

61. An apparatus according to claim 2, wherein said reducing and radiating means includes one of an aluminum nitride and silicon layer buried in said anode and cathode electrodes.

62. An apparatus according to claim 2, wherein said reducing and radiating means includes an aluminum nitride layer.

63. An apparatus according to claim 62, wherein said aluminum nitride layer has at least one hole for housing each of said semiconductor switching element chips, said hole having a step.

64. An apparatus according to claim 2, wherein said reducing and radiating means includes a powdery aluminum nitride layer.

65. An apparatus according to claim 2, wherein said reducing and radiating means includes a silicon layer covered with silicon oxide.

66. An apparatus according to claim 2, wherein said reducing and radiating means includes an electrically conductive material layer.

67. An apparatus according to claim 2, wherein at least one of said anode and cathode electrodes has means for reducing a thermal stress induced in said chips and for conducting heat from said chips to said electrodes.

68. An apparatus according to claim 67, wherein an electrically conductive material connected to said chips and having a thickness allowing said electrically conductive material to deform more easily than said chips is located between said reducing and radiating means and said chips.

69. An apparatus according to claim 67, wherein said means includes one of aluminum nitride and a metal.

70. An apparatus according to claim 67, wherein each of said anode and cathode electrodes comprises an aluminum nitride plate covered with an electrically conductive material.

71. An apparatus according to claim 3, wherein an electrically conductive material connected to said chips and having a thickness allowing said electrically conductive material to deform more easily than said chips is located between said reducing and conducting means and said chips.

72. An apparatus according to claim 3, wherein said reducing and conducting means includes one of aluminum nitride and a metal.

73. An apparatus according to claim 3, wherein each of said anode and cathode electrodes comprises an aluminum nitride plate covered with an electrically conductive material.

74. An apparatus according to claim 27, wherein said reducing and radiating means includes an aluminum nitride layer.

75. An apparatus according to claim 27, wherein said reducing and radiating means includes powdery aluminum nitride layers.

76. An apparatus according to claim 27, wherein said reducing and radiating means includes a silicon layer covered with a silicon oxide layer.

77. An apparatus according to claim 27, wherein said reducing and radiating means has an electrically conductive material layer.

* * * * *

UNITED STATES PATENT AND TRADEMARK OFFICE
CERTIFICATE OF CORRECTION

PATENT NO. : 5,006,921
DATED : April 9, 1991
INVENTOR(S) : Masaru Ishizuka et al.

It is certified that error appears in the above-identified patent and that said Letters Patent is hereby corrected as shown below:

On the title page, in item [54] and in column 1, lines 1-3:
    The title is incorrect, should be, --POWER SEMICONDUCTOR SWITCHING APPARATUS WITH HEAT SINK--.

Signed and Sealed this

Third Day of November, 1992

*Attest:*

DOUGLAS B. COMER

*Attesting Officer*      *Acting Commissioner of Patents and Trademarks*